United States Patent [19]

Sato et al.

[11] Patent Number: 5,434,465
[45] Date of Patent: Jul. 18, 1995

[54] SURFACE ACOUSTIC WAVE DEVICE

[75] Inventors: Takahiro Sato; Hidenori Abe, both of Toda, Japan

[73] Assignee: Nikko Kyondo Co., Ltd., Tokyo, Japan

[21] Appl. No.: 236,015

[22] Filed: May 2, 1994

Related U.S. Application Data

[63] Continuation of Ser. No. 29,512, Mar. 11, 1993, abandoned.

[30] Foreign Application Priority Data

Mar. 13, 1992 [JP] Japan .................................. 4-088409
Mar. 3, 1993 [JP] Japan .................................. 5-042642

[51] Int. Cl.⁶ .......................................... H01L 41/08
[52] U.S. Cl. .................................. 310/313 A; 310/360
[58] Field of Search ........... 310/313 A, 313 B, 313 D, 310/313 R, 360

[56] References Cited

U.S. PATENT DOCUMENTS

| | | | |
|---|---|---|---|
| 4,489,250 | 12/1984 | Ebata et al. | 310/313 A |
| 4,523,119 | 6/1985 | Whatmore et al. | 310/313 A |
| 4,634,913 | 1/1987 | Whatmore et al. | 310/313 A |
| 4,672,255 | 6/1987 | Suzuki et al. | 310/313 A |

FOREIGN PATENT DOCUMENTS 5-7124  1/1993  Japan .

Primary Examiner—Mark O. Budd
Attorney, Agent, or Firm—Dickstein, Shapiro & Morin

[57] ABSTRACT

A surface acoustic wave device comprises a piezoelectric substrate of lithium tetraborate single crystal, and a metal film formed on the surface of the piezoelectric substrate for exciting, receiving, reflecting and/or propagating surface acoustic waves, the metal film being so formed that a cut angle of the surface of the piezoelectric substrate and propagation direction of the surface acoustic wave are an Eulerian angle representation of (0°–45°, 30°–90°, 40°–90°) and directions equivalent thereto, the surface acoustic wave having higher propagation velocity than Rayleigh waves and leaky waves, and a characteristic of radiating part of energy of the surface acoustic wave into the piezoelectric surface while propagating.

28 Claims, 13 Drawing Sheets

SURFACE ACOUSTIC WAVE DEVICE

This application is a continuation of application Ser. No. 08/029,512, filed Mar. 11, 1993, now abandoned.

BACKGROUND OF THE INVENTION

The present invention relates to a surface acoustic wave device using lithium tetraborate single crystal ($Li_2B_4O_7$).

Surface acoustic wave devices are circuit elements which convert electric signals into surface waves for the signal processing, and are used in filters, resonators, delay lines, etc. Usually a surface acoustic wave device includes metal electrodes, the so-called interdigital transducers (IDTs) on a piezoelectric elastic substrate, whereby electric signals are converted into or reconverted from surface acoustic waves.

Rayleigh waves are dominantly used as the surface acoustic waves. Rayleigh waves are surface waves which propagate on elastic surfaces and propagate without radiating its energy into the piezoelectric substrate, i.e., theoretically without propagation losses. The known substrate material of surface acoustic wave devices using Rayleigh waves are quartz and lithium tantalate ($LiTaO_3$). Quartz has good temperature stability but poor piezoelectricity. Conversely lithium tantalate has good piezoelectricity but poor temperature stability. Recently noted as a material which satisfies both properties is lithium tetraborate single crystal (refer to, e.g., Japanese Patent Publication Nos. 44169/1990 and 40044/1988).

Another alternative has been proposed, namely the use of surface acoustic waves (leaky surface acoustic waves, pseudo surface waves) which propagate by radiating a part of their energy in the direction of depth of an elastic body. Generally leaky waves are not usable in surface acoustic wave devices because of their high propagation losses due to the diffusion, but depending on specific cut angles and propagation directions, their propagation losses can be reduced usably in surface acoustic wave devices. For example, it is known that a surface acoustic wave device of lithium tantalate cut in 36° Y-X-cut which can provide a propagation velocity of about 4200 m/sec.

Characteristics of Rayleigh waves and leaky waves can be simulated by the relational expressions which will be explained below (J. J. Campbell, W. R. Jones, "A Method for Estimating Optimal Crystal Cuts and Propagation Directions for Excitation of Piezoelectric Surface Waves" IEEE Trans on Sonics and Ultrasonics, Vol. SU-15, No. 4, pp. 209–217 (1968), and T. C. Lim, G. W. Farnell, "Character of Pseudo Surface Waves on Anisotropic Crystals", Journal of Acoustic Society of America, Vol. 45, No. 4, pp 845–851 (1968)).

Generally propagation characteristics of surface acoustic waves propagating on piezoelectric surfaces can be given by solving an equation of motion and a charge equation given by a Maxwell's equation under quasi-static approximation. The equation of motion and the charge equation are expressed as follows.

$$C_{ijkl}U_{k,li} + e_{kij}\phi_{,ki} = \rho \ddot{U}_j \quad (1)$$

$$e_{ikl}U_{k,li}\epsilon_{ik}\phi_{,ki} = 0 \quad (2)$$

where $C_{ijkl}$ (i, j, k, l = 1, 2, 3) represents a tensor of an elastic constant; $e_{ikl}$ (i, k, l = 1, 2, 3) represents a tensor of a piezoelectric constant; $\epsilon^{ik}$ (i, k = 1, 2, 3) represents a tensor of a dielectric constant; and $\rho$ represents a density.

$U_i$ represents displacements in respective directions of the coordinate system of FIG. 1 (where $X_1$ indicates a propagation direction of a surface acoustic wave; $X_2$ indicates a direction perpendicular to the propagation direction $X_1$ of the surface acoustic wave included in the elastic substrate surface; $X_3$ indicates a direction perpendicular to the $X_1$ and $X_2$). $\phi$ represents an electrostatic potential. Displacements $U_i$ and an electrostatic potential $\phi$ are expressed by the following equations.

$$U_i = \beta_i \cdot e^{jk(ax3+x1-vt)} \quad (3)$$

$$\phi = \beta_4 \cdot e^{jk(ax3+x1-vt)} \quad (4)$$

where $a$ represents decay constant in the direction $X_3$; $\beta_i$ represents an amplitude constant; k represents a wave number; t represents a time; and v represents a phase velocity (propagation velocity).

First, the procedure of the Rayleigh wave simulation will be explained. The equation of motion (1) and the charge equation (2) are replaced by the equation (3) expressing displacements $U_i$ and the equation (4) expressing an electrostatic potential $\phi$ to be rewritten with respect to an amplitude constant $\beta_i$. And an eighth-order equation of the decay constants a is given. Assuming that a phase velocity v is a real number, this equation gives decay constants a in a solution of a complex conjugate.

For a surface acoustic wave, an amplitude of the wave must be decayed in the direction of depth of the substrate, and for decay constants a are selected solutions having minus imaginary parts, [$Im(\beta(n)) < 0$, n = 1, 2, 3, 4]. Four amplitude constants $\beta_1$–$\beta_4$ are calculated corresponding to the respective selected decay constants $a$. By referring to the corresponding amplitude constant $\beta_1$–$\beta_4$, it is found that the four selected decay constants $a$ correspond respectively to a longitudinal wave component having a displacement in the direction $x_1$ as the main component, two kinds of shear components having as the main components a displacement in the direction $x_2$ or $x_3$, and an electromagnetic component having an electrostatic potential as the main component. Based on the fact that these four components of the surface acoustic wave can propagate, displacements $U_i$ and electrostatic potentials $\phi$ of the surface acoustic wave in the respective directions which the surface acoustic wave can propagate are expressed in a linear combination of four modes as expressed by the following equations.

$$u_i = \sum_{n=1}^{4} A^{(n)} \cdot \beta_i^{(n)} \cdot e^{jk(a(n)x3+x1-vt)} \quad (5)$$

$$\phi = \sum_{n=1}^{4} A^{(n)} \cdot \beta_4^{(n)} \cdot e^{jk(a(n)x3+x1-vt)} \quad (6)$$

where $A^{(n)}$ represents an amplitude ratio among the respective modes.

Then boundary conditions are given to the above equations (5) and (6), whereby propagation characteristics of the surface acoustic wave are given. The mechanical boundary conditions are that the normal components of stress at surface are zero [$T_{13} = T_{23} = T_{33} = 0$ at $x_3 = 0$]. For free surface (electrically open), the electrical boundary condition requires that the normal component of electric flux density at surface is zero [$D_3=0$ at $x_3=0$]. For shorted surface (electrically short), the electrical boundary condition requires that electrostatic potential is zero [$\phi=0$ at $x_3=0$]. By giving a phase velocity v which satisfies these boundary conditions, propagation characteristics of the Rayleigh wave of the surface acoustic wave can be solved.

Next, the simulation procedure of the leaky wave will be explained. In the above-described simulation of the Rayleigh wave, when the equations (3) and (4) are substituted in the equations (1) and (2) to give decay constants a, depending an assumed value of a phase velocity v, sometimes a solution of decay constants $\alpha$ is not given in a complex conjugate, but in a real number. To be specific, when a phase velocity v faster than the Rayleigh wave is assumed, a part of decay constants $\alpha$ corresponding to one of the shear wave components (hereinafter called "the first shear wave component") are real. A component which is not decayed in the direction of depth of the piezoelectric substrate exists. Accordingly all the energy of the surface acoustic wave is not concentrated on the piezoelectric surface, and a part of the energy radiates in the direction of depth of the piezoelectric substrate. Propagation losses take place.

In this case, when the phase velocity v is simulated in a complex number as a mathematical expression of a propagation loss, the coefficients of the eighth-order equation for giving the decay constants $\alpha$ are in a complex number. Out of eight solutions of the decay constants $\alpha$, three solutions whose amplitudes decay in the direction of depth of the substrate are selected for the three components other than the first shear wave component. For the first shear wave component, another solution whose amplitude does not decay in the direction of depth of the piezoelectric substrate surface is selected. Then the boundary conditions described above in connection with the equations (5) and (6) are applied to give propagation characteristics of the leaky wave of the surface acoustic wave, which is generally called "leaky wave" ("leaky surface acoustic wave" or "pseudo surface acoustic wave").

But in the surface acoustic wave device including the substrate of lithium tetraborate, the propagation velocity of the Rayleigh wave is relatively slow, and the leaky wave, whose propagation loss is sufficiently low, is not found. Accordingly such surface acoustic wave device has found it difficult to process signals of higher frequencies.

That is, an electrode width of interdigital transducers (IDTs), and an inter-electrode gap thereof are normally set to be ¼ of a wavelength of a surface acoustic wave corresponding to a signal frequency to be processed. The propagation velocity of Rayleigh waves on lithium tetraborate single crystal is about 3400 m/sec, and an electrode width and an inter-electrode gap of below 1 $\mu$m are necessary to process signal frequencies of above 1 GHz. Accordingly fabrication yields of the interdigital transducers are lowered, and thus the fabrication of surface acoustic wave devices becomes very difficult.

SUMMARY OF THE INVENTION

An object of the present invention is to provide a surface acoustic wave device which includes a lithium tetraborate single crystal substrate to make use of surface acoustic waves having high propagation velocities and low propagation losses, whereby frequencies to be signal-processed can be as high as above 1 GHz.

To achieve the above-described object, a surface acoustic wave device according to a first invention of the present application comprises a piezoelectric substrate of lithium tetraborate single crystal, and electrodes formed on the surface of the piezoelectric substrate for exciting, receiving, reflecting and/or propagating surface acoustic waves, the electrodes being so formed that a cut angle of the surface of the piezoelectric substrate and propagation direction of the surface acoustic wave are an Eulerian angle representation of (0°–45°, 30°–90°, 40°–90°) and directions equivalent thereto, and the surface acoustic wave having a propagation velocity which is higher than that of a fast shear bulk wave propagating in the same direction as the surface acoustic wave and does not exceed that of a longitudinal bulk wave.

A surface acoustic wave device according to a second invention of the present application comprises a piezoelectric substrate of lithium tetraborate single crystal, and electrodes formed on the surface of the piezoelectric substrate for exciting, receiving, reflecting and/or propagating surface acoustic waves, the electrodes being so formed that a cut angle of the surface of the piezoelectric substrate and propagation direction of the surface acoustic wave are an Eulerian angle representation of (0° –45°, 38°–55°, 80°-90°) and directions equivalent thereto. The cut surface of the piezoelectric substrate may be (011), (345), (255), (231), (356), (112), (123), (233), (134), (122), (234), (023), (145), (156), (165), (347), etc.

It is preferable that the electrodes are so formed that a cut angle of the surface of the piezoelectric substrate and propagation direction of the surface acoustic wave are an Eulerian angle representation of (0°, 45°–50°, 80°-90°) and directions equivalent thereto.

It is preferable that the cut surface of the substrate is (011), (345), (255), (231), (356), etc. Especially preferably the electrodes are so formed that a cut angle of the surface of the piezoelectric substrate and propagation direction of the surface acoustic wave are an Eulerian angle representation of (0°–2°, 45°–50°, 88°-90°) and directions equivalent thereto.

It is preferable that the electrodes are formed of a metal containing aluminium as the main component, and the electrodes have a normalized film thickness of below about 8%.

The inventors of the present application predicted that, when a cut angle of a piezoelectric substrate and a propagation direction of the surface acoustic wave are specifically set, a surface acoustic wave (hereinafter called "the present SAW"), which has the longitudinal wave component as the main component, and propagate over the piezoelectric substrate surface, radiating the two kinds of shear waves as a bulk wave into the piezoelectric substrate, and confirmed their prediction by simulations.

The present SAW is theorized by an development of the theory of leaky waves. When a phase velocity v is assumed to be a real number which is higher than leaky waves, the imaginary part of decay constants corresponding to the two kinds of shear wave components are 0 (i.e., real numbers) and those components do not decay in the direction of depth of the piezoelectric substrate. In simulations of the present SAW, when the equations (3) and (4) are substituted in the equations (1) and (2) to obtain decay constants a, based on a phase velocity v expanded into a complex number, those of the given solutions which do not decrease the amplitude in the direction of depth of the substrate are selected for the two kinds of shear wave components (the first shear component and a second shear component). For the rest two decay constants a, those of the solutions whose amplitudes decrease in the direction of depth of the substrate are selected. That is, the present SAW is surface acoustic waves which propagate over the surface, leaking energy into the substrate with the two kinds of shear wave components as bulk waves.

Based on the thus-given phase velocity v, a phase velocity $V_P$ in the direction $x_1$, an electromechanical coupling factor $k^2$, a propagation loss L, and a temperature coefficient of frequency TCF were given. A phase velocity $v_p$, an electromechanical coupling factor $k^2$ and a propagation loss L and a temperature coefficient of frequency TCF are given by the following equations.

$$v_p = \frac{1}{Re(1/v)} \quad (7)$$

$$k^2 = 2 \frac{(v_{po} - v_{ps})}{v_{po}} \quad (8)$$

$$L = 2\pi \times 8.686 \times \frac{Im(v)}{Re(v)} \text{ [dB/}\lambda\text{]} \quad (9)$$

$$TCF = \frac{1}{v_p} \frac{\partial v_p}{\partial T} - \alpha_T \quad (10)$$

where $v_{po}$ and $v_{ps}$, represent phase velocities in the direction $x_1$ respectively when the surface is electrically open and shorted; and $a_T$ represents a thermal expansion coefficient in the direction $x_1$.

Simulations were made for the purpose of simulating surface acoustic wave characteristics obtained when a cut angle and a propagation direction of a lithium tetraborate single crystal substrate are changed. Propagation characteristics were simulated in terms of elastic constants, piezoelectric constants and dielectric constants when a cut angle and a propagation direction were changed by an Eulerian angle ($\phi$, $\theta$, $\psi$). A phase velocity of a bulk wave (longitudinal waves, fast shear waves, slow shear waves) propagating in the same direction were simulated.

Here an Eulerian angle ($\phi$, $\theta$, $\psi$) will be explained with reference to FIG. 31. As in the coordinate system of FIG. 1, $X_1$ represents a propagation direction of an surface acoustic wave; $X_2$, a direction perpendicular to the propagation direction $X_1$ of the surface acoustic wave, which is included in a piezoelectric substrate, and $X_3$, a direction perpendicular to $X_1$ and $X_2$. A reference Eulerian angle (0°, 0°, 0°) is obtained when the $X_1$, $X_2$, and $X_3$ are respectively crystallographic axes X, Y, and Z (or crystallographic axes a, b, and c). First, the propagation direction $X_1$ of the surface acoustic wave is rotated on the $X_3$ direction by the angle $\phi$ from the X-axis toward the Y-axis. Then the direction $X_3$, which is perpendicular to the substrate surface, is rotated by the angle $\theta$ counter-clockwise from the Z-axis on the rotated $X_1$ direction. Next the propagation direction $X_1$ is again rotated by the angle $\psi$ counter-clockwise on the rotated $X_3$ direction in plane of the substrate surface. The thus-obtained direction (a propagation direction of a surface acoustic wave including a cut angle (cut surface) of the substrate) is represented by an Eulerian angle ($\phi$, $\theta$, $\psi$).

Next, the results of the simulations will be explained with reference to FIGS. 2 to 22.

FIGS. 2 to 4 show the results of the simulations in which in a surface acoustic wave device including electrodes of aluminium as the main component formed on a lithium tetraborate single crystal substrate, a phase velocity $v_p$ and electromechanical coupling factor $k^2$ of the surface acoustic wave, and a propagation loss L per one wavelength of the surface acoustic wave were simulated with a propagation direction of the surface acoustic wave represented by an Eulerian angle (0°, $\theta$, 90°), and the angle $\theta$ is changed.

As shown in FIG. 2, the phase velocity of the present SAW is always so high as 5000–7500 m/sec even when the angle $\theta$ is changed, and is higher than the fast shear bulk wave and does not exceed a phase velocity of the longitudinal bulk wave thereof. As shown in FIG. 3, the present SAW exists in a wide range where the angle $\theta$ is 25°–90°. In a range where the angle $\theta$ is 38°–70°, an electromechanical coupling factor of above 0.6% is available, and an electromechanical coupling factor of above 1% is available especially in a range where the angle $\theta$ is 40°–60°. As shown in FIG. 4, in a range where the angle $\theta$ is below about 55°, the propagation loss is low.

Thus, the present SAW has high electromechanical coupling factors and low propagation losses in an angle $\theta$ range of 38°–55°. The propagation loss is much lower especially in an angle $\theta$ range of 45°–50°. In these ranges, the Rayleigh wave has a velocity of 3000–4000 m/sec, which is about ½ of that of the present SAW, but no leaky wave is present.

FIGS. 5 to 7 show the results of the simulations on the phase velocity $v_p$, electromechanical coupling factor $k^2$ and propagation loss L obtained when the propagation direction of the surface acoustic wave was represented by an Eulerian angle (15°, $\theta$, 90°), and the angle $\theta$ is changed. FIGS. 8 to 10 show the results of the simulations on the phase velocity $v_p$, electromechanical coupling factor $k^2$ and propagation loss L obtained when the propagation direction of the surface acoustic wave was represented by an Eulerian angle (30°, $\theta$, 90°), and the angle $\theta$ is changed. FIGS. 11 to 13 show the results of the simulations on the phase velocity $v_p$, electromechanical coupling factor $k^2$ and propagation loss L obtained when the propagation direction of the surface acoustic wave was represented by an Eulerian angle (45°, $\theta$, 90°), and the angle $\theta$ is changed.

As shown in FIGS. 2 to 13, it is found that taking into the symmetry of lithium tetraborate, irrespective of the angle $\theta$ of the Eulerian angle ($\phi$, $\theta$, $\psi$,), the present SAW has high phase velocities in an angle $\theta$ range of 30°–90°, and in an angle $\theta$ range of 38°–55°, the present SAW has high phase velocities, high electromechanical coupling factors and low propagation losses. Especially in an angle range of 45°–50°, the propagation loss of the present SAW is much lower. The phase velocity of the present SAW is higher than the fast shear bulk wave and does not exceed the phase velocity of the longitudinal bulk wave.

Next, the propagation characteristics of the surface acoustic wave on a cut (011) surface of a piezoelectric substrate in an Eulerian angle representation of (0°, 47.3°, $\psi$) was simulated.

FIGS. 14 to 16 show the results of the simulation made on the phase velocity $v_p$, electromechanical coupling factor $k^2$ and propagation loss L with the angle $\theta$ of the Eulerian angle (0°, 47.3°, $\psi$) changed.

As shown in FIG. 14, the present SAW constantly has a propagation characteristic of 7000-7500 m/sec even with the angle ψ changed. As shown in FIG. 15, the present SAW is present in an angle θ range of 40°-90° and has high electromechanical coupling factors in an angle ψ range of 80° to 90°. As shown in FIG. 16, in an angle ψ range of 88°-90° the present SAW has very low propagation losses. Accordingly the present SAW has a maximum electromechanical coupling factor and a minimum propagation loss at an angle ψ of 90°.

The propagation characteristics of the surface acoustic wave with an propagation direction of the surface acoustic wave represented in an Eulerian angle (0°, 47.3°, 90°) were simulated FIGS. 17 to 20 show the results of the simulation made on the phase velocity $v_p$, electromechanical coupling factor $k^2$, propagation loss L and temperature coefficient of frequency TCF with the electrodes formed of a metal material containing aluminium as the main component, and an electrode film thickness changed. In this simulation, the electric opened boundary means that the electric flux density in the direction $x_3$ on the interface between the metal film and the substrate is 0 (i.e., $D_3=0$ at $x_3=0$), and the electric shorted boundary means that a potential of the metal film is 0 (i.e., $\phi=0$ at $x_3=0$).

When a normalized film thickness $h/\lambda$ of an electrode film thickness h by a wavelength λ of the surface acoustic wave is changed from 0.0% to 6.0%, as shown in FIG. 17 the phase velocity gradually lowers, and as shown in FIG. 18 the electromechanical coupling factor increases from 1.2% to 3.1%. As shown in FIG. 19, it is found that the propagation loss is as low as 0.01 dB/λ in a normalized film thickness range of 0.0 to 8.0%. As shown in FIG. 20, the frequency temperature characteristic is as good as below about 20 ppm/°C. in a normalized film thickness range of 0.0-5.0%.

Next, to confirm the characteristics of the present SAW, distributions of displacements of the present SAW and the electrostatic potentials in the direction of depth of the substrate were simulated.

FIGS. 21 and 22 show the results of the simulations in which an propagation direction of the surface acoustic wave is represented by an Eulerian angle (0°, 47.3°, 90°), and the electrodes (of aluminium) have a normalized film thickness of 3%. FIG. 21 shows the simulation result of the case of the electric opened boundary. FIG. 22 shows the simulation result of the case of the electric shorted boundary. In FIGS. 21 and 22, displacements $U_1$ (displacements in the direction $x_1$), displacements $U_3$ (displacements in the direction $x_3$) and relative amplitude values of the electrostatic potential $\phi$ are taken respectively on the horizontal axes, and normalized depths by wavelengths are taken on the vertical axes. Displacement $U_2$ (displacements in the direction $X_2$) are zero.

As shown in FIGS. 21 and 22, the displacements of the surface acoustic wave and the electrostatic potentials are concentrated near the substrate surface, and the longitudinal wave component is dominant.

Thus, according to a first invention of the present application, the cut angle and the propagation direction of the surface acoustic wave of the lithium tetraborate single crystal substrate are an Eulerian angle representation of (0°-45°, 30°-90°, 40°-90°) and directions equivalent thereto. Accordingly a surface acoustic wave device which makes the use of the surface acoustic wave with higher propagation velocities than the Rayleigh wave and the leaky wave can be realized.

According to a second invention of the present application, a cut angle of the lithium tetraborate single crystal substrate and a propagation direction of the surface acoustic surface are an Eulerian angle representation of (0°-45°, 38°-55°, 80°-90°) and directions equivalent thereto. Accordingly a surface acoustic device which makes use of the surface acoustic wave having high propagation velocities and sufficient electromechanical coupling factors can be realized.

By setting the range at an Eulerian angle representation of (0°-45°, 45°-50°, 80°-90°) and directions equivalent thereto, a surface acoustic wave device which makes use of the surface acoustic wave having high propagation velocities, sufficient electromechanical coupling factors and low propagation losses can be realized.

By forming the electrodes on the surface acoustic wave device of a metal containing aluminium as the main component, and setting a normalized film thickness of the electrodes at below about 5%, a surface acoustic wave device which makes use of the surface acoustic wave with high propagation velocities, sufficient electromechanical coupling factors, low propagation losses and good temperature characteristics can be realized.

Thus, according to the present invention, a surface acoustic wave device which makes use of surface acoustic wave having high propagation velocities, sufficient electromechanical coupling factors, low propagation losses and good temperature characteristics, and the surface acoustic wave device according to the present invention is sufficiently applicable to higher-frequency operations.

Because lithium tetraborate single crystal has point group 4 mm symmetry, and the characteristics of its surface acoustic wave have set symmetry, the above-described Eulerian angles have set symmetry, and the directions indicated by the Eulerian angles include the equivalent directions (0°-360°, 38°-55°, 80°-100°), etc.

DETAILED DESCRIPTION OF THE INVENTION

The surface acoustic wave device according to one example of the present invention will be explained with reference to FIGS. 23 to 28.

Figure 1:
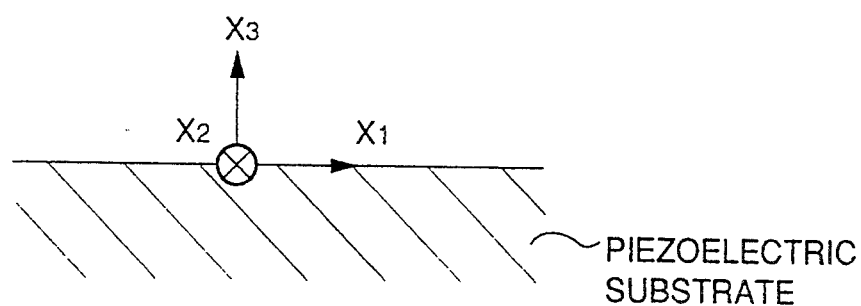
FIG. 1 is a view of the coordinate system used in the simulations of the surface acoustic wave, and the boundary conditions.
Figure 2:
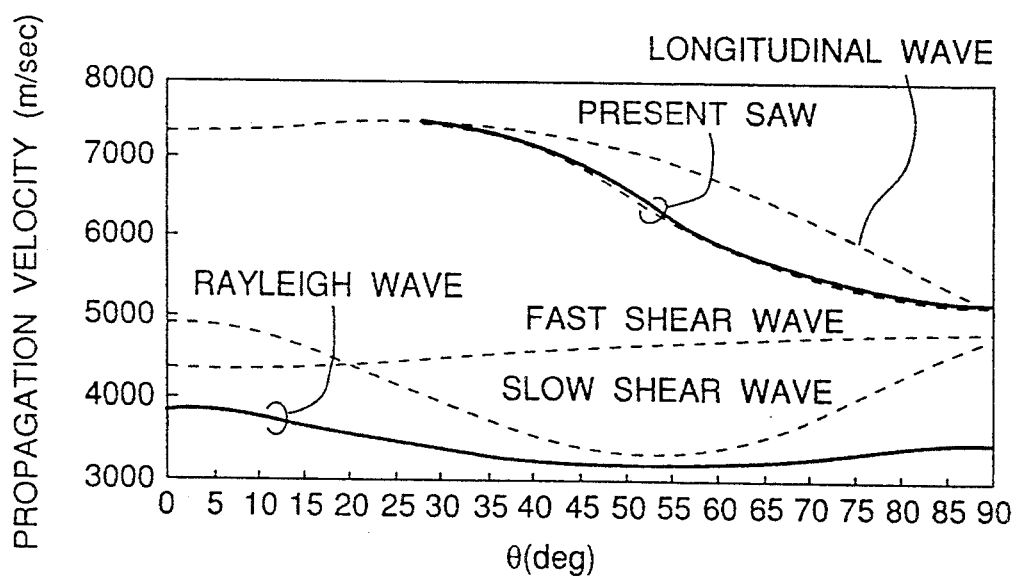
FIG. 2 is a graph of the result of the simulation, in a surface acoustic wave device comprising electrodes formed of aluminium as the main component on a lithium tetraborate single crystal substrate, on a propagation velocity (phase velocity) $v_p$ obtained when the angle θ of a cut angle of the lithium tetraborate single crystal substrate and a propagation direction (0°, θ, 90°) are changed.
Figure 3:
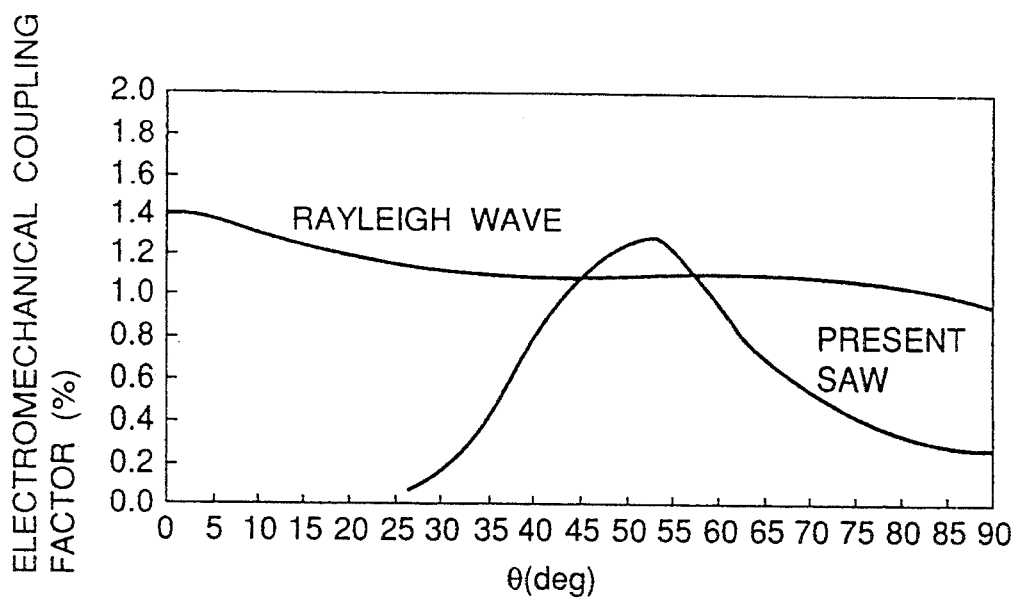
FIG. 3 is a graph of the result of the simulation, in a surface acoustic wave device comprising electrodes formed of aluminium as the main component on a lithium tetraborate single crystal substrate, on an electromechanical coupling factor $k^2$ obtained when the angle θ of a cut angle of the lithium tetraborate single crystal substrate and a propagation direction (0°, θ, 90°) are changed.
Figure 4:
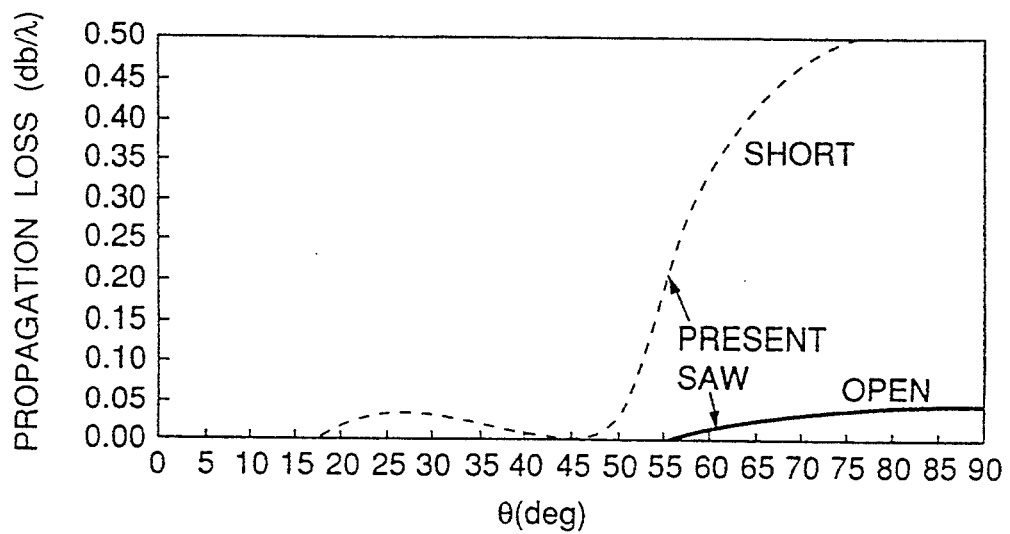
FIG. 4 is a graph of the result of the simulation, in a surface acoustic wave device comprising electrodes formed of aluminium as the main component on a lithium tetraborate single crystal substrate, on a propagation loss L obtained when the angle θ of a cut angle of the lithium tetraborate single crystal substrate and a propagation direction (0°, θ, 90°) are changed.
Figure 5:
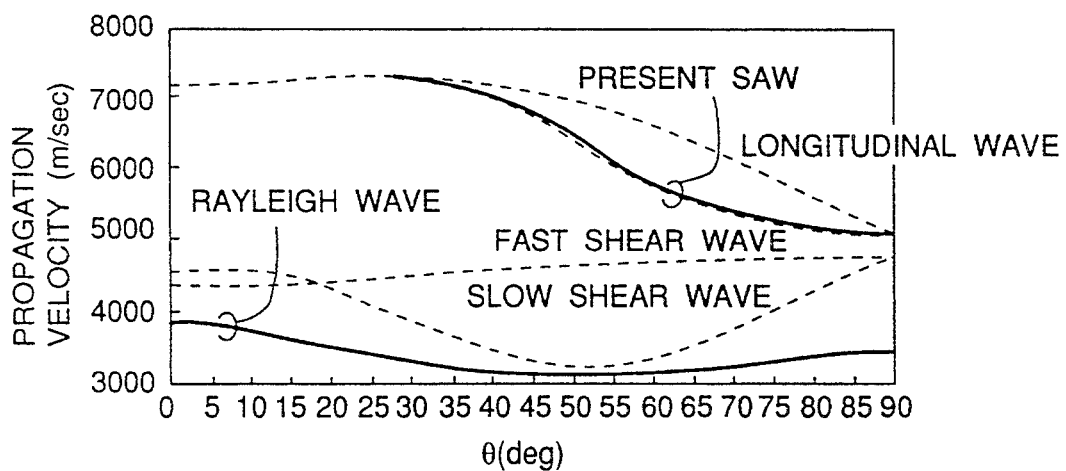
FIG. 5 is a graph of the result of the simulation, in a surface acoustic wave device comprising electrodes formed of aluminium as the main component on a lithium tetraborate single crystal substrate, on a propagation velocity $v_p$ obtained when the angle θ of a cut angle of the lithium tetraborate single crystal substrate and a propagation direction (15°, θ, 90°) are changed.
Figure 6:
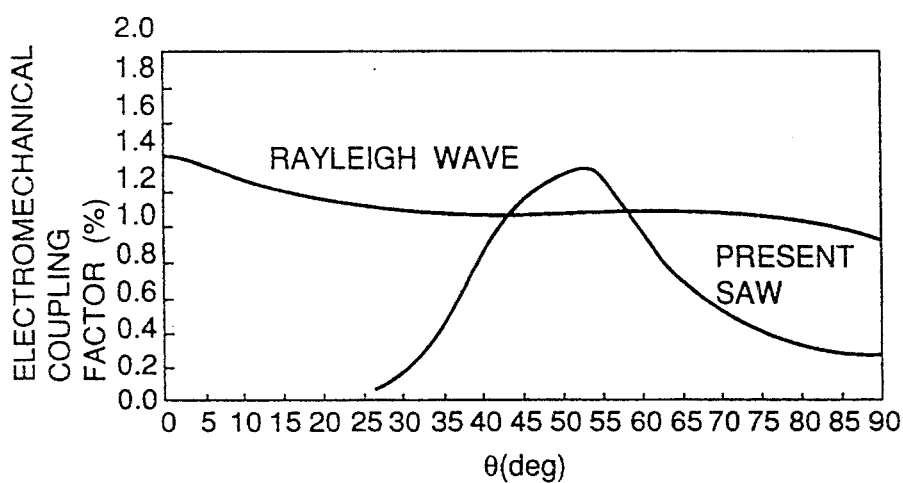
FIG. 6 is a graph of the result of the simulation, in a surface acoustic wave device comprising electrodes formed of aluminium as the main component on a lithium tetraborate single crystal substrate, on an electromechanical coupling factor $k^2$ obtained when the angle θ of a cut angle of the lithium tetraborate single crystal substrate and a propagation direction (15°, θ, 90°) are changed.
Figure 7:
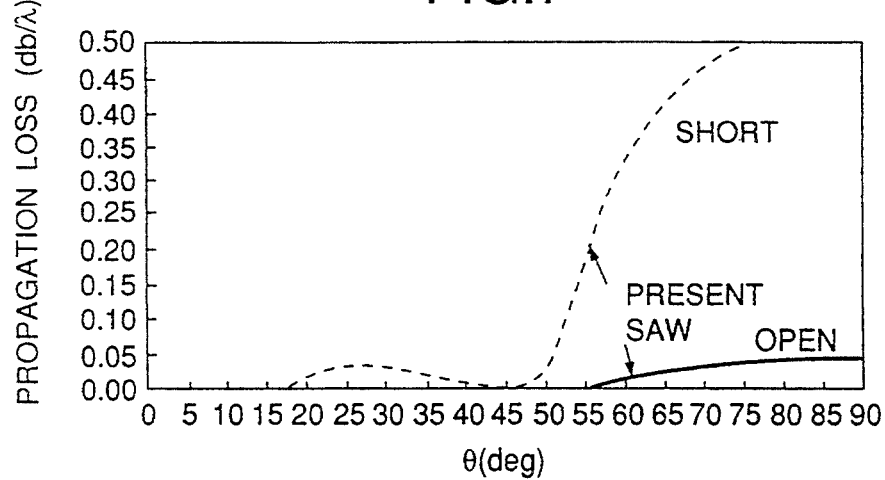
FIG. 7 is a graph of the result of the simulation, in a surface acoustic wave device comprising electrodes formed of aluminium as the main component on a lithium tetraborate single crystal substrate, on a propagation loss L obtained when the angle θ of a cut angle of the lithium tetraborate single crystal substrate and a propagation direction (15°, θ, 90°) are changed.
Figure 8:
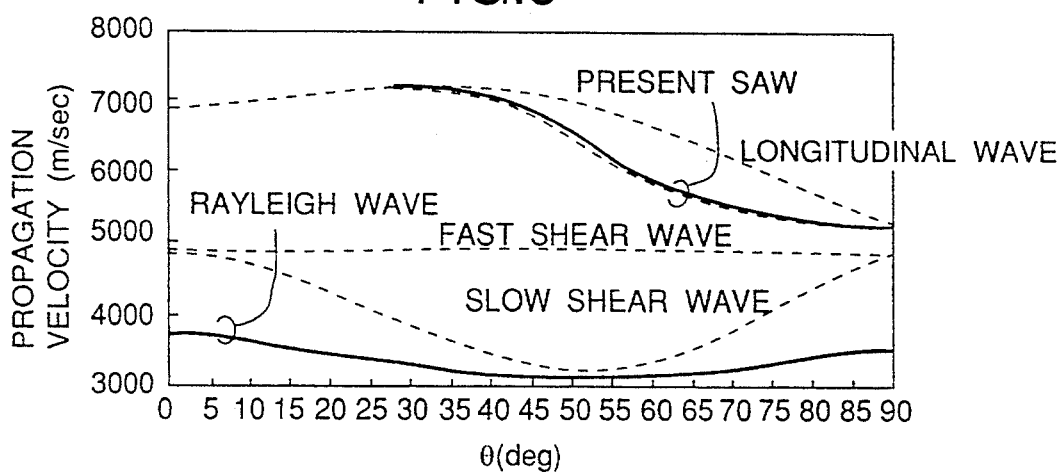
FIG. 8 is a graph of the result of the simulation, in a surface acoustic wave device comprising electrodes formed of aluminium as the main component on a lithium tetraborate single crystal substrate, on a propagation velocity $v_p$ obtained when the angle θ of a cut angle of the lithium tetraborate single crystal substrate and a propagation direction (30°, θ, 90°) are changed.
Figure 9:
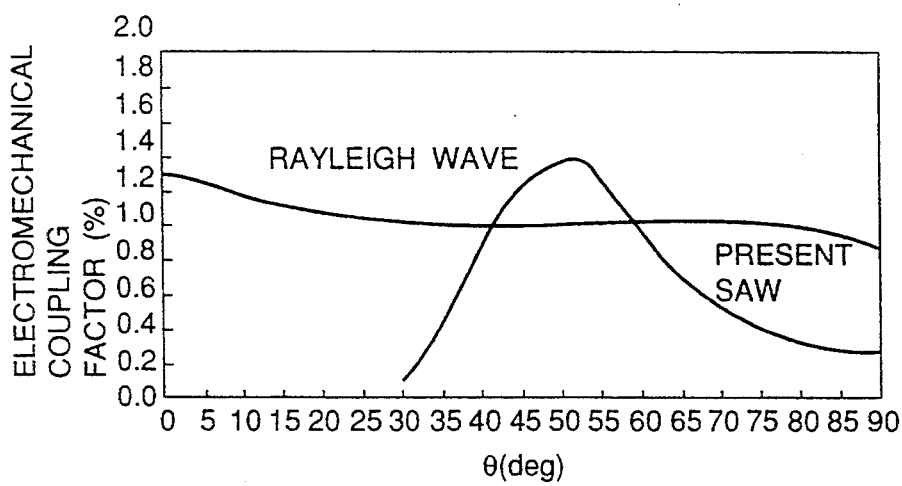
FIG. 9 is a graph of the result of the simulation, in a surface acoustic wave device comprising electrodes formed of aluminium as the main component on a lithium tetraborate single crystal substrate, on an electromechanical coupling factor $k^2$ obtained when the angle θ of a cut angle of the lithium tetraborate single crystal substrate and a propagation direction (30°, θ, 90°) are changed.
Figure 10:
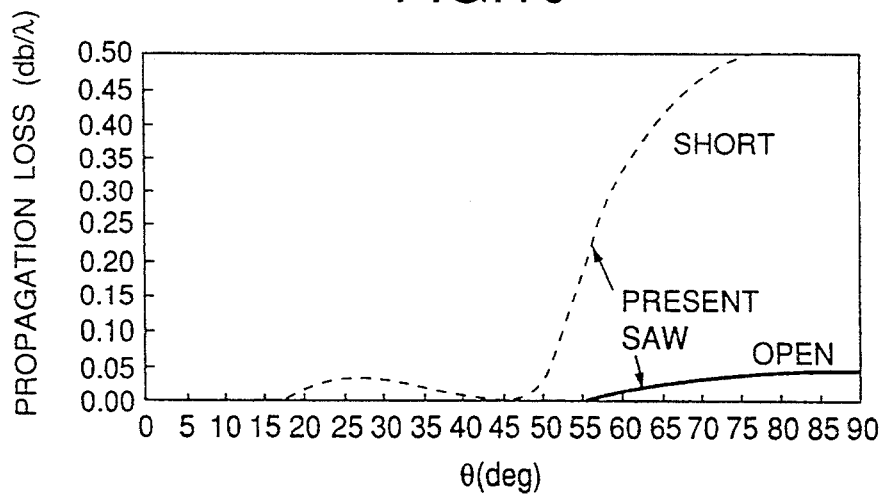
FIG. 10 is a graph of the result of the simulation, in a surface acoustic wave device comprising electrodes formed of aluminium as the main component on a lithium tetraborate single crystal substrate, on a propagation loss L obtained when the angle θ of a cut angle of the lithium tetraborate single crystal substrate and a propagation direction (30°, θ, 90°) are changed.
Figure 11:
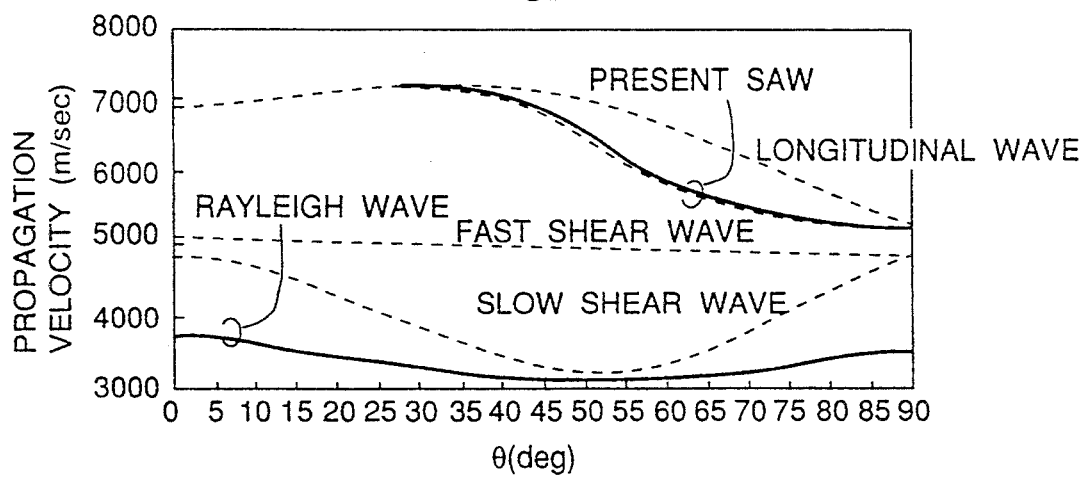
FIG. 11 is a graph of the result of the simulation, in a surface acoustic wave device comprising electrodes formed of aluminium as the main component on a lithium tetraborate single crystal substrate, on a propagation velocity $v_p$ obtained when the angle θ of a cut angle of the lithium tetraborate single crystal substrate and a propagation direction (45°, θ, 90°) are changed.
Figure 12:
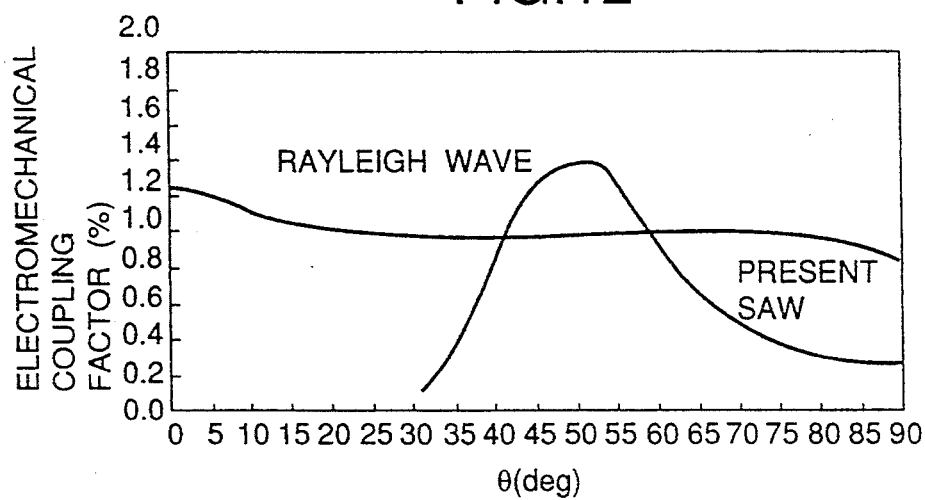
FIG. 12 is a graph of the result of the simulation, in a surface acoustic wave device comprising electrodes formed of aluminium as the main component on a lithium tetraborate single crystal substrate, on an electromechanical coupling factor $k^2$ obtained when the angle θ of a cut angle of the lithium tetraborate single crystal substrate and a propagation direction (45°, θ, 90°) are changed.
Figure 13:
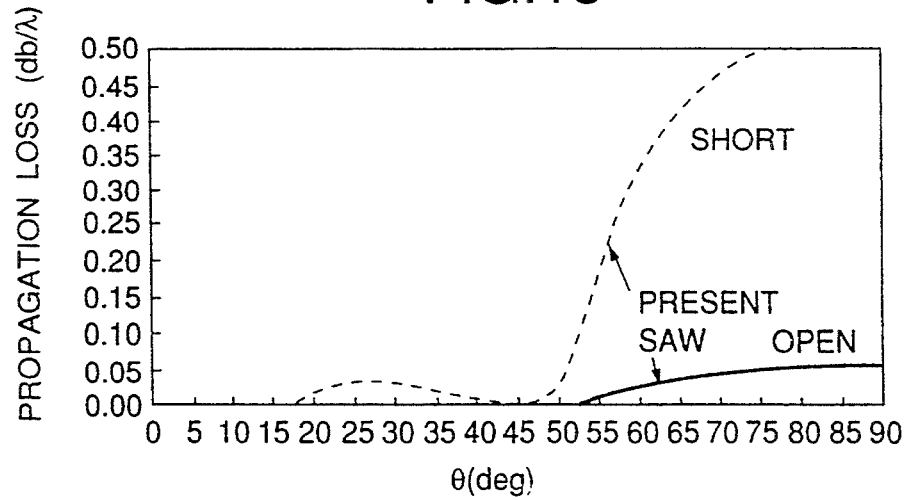
FIG. 13 is a graph of the result of the simulation, in a surface acoustic wave device comprising electrodes formed of aluminium as the main component on a lithium tetraborate single crystal substrate, on a propagation loss L obtained when the angle θ of a cut angle of the lithium tetraborate single crystal substrate and a propagation direction (45°, θ, 90°) are changed.
Figure 14:
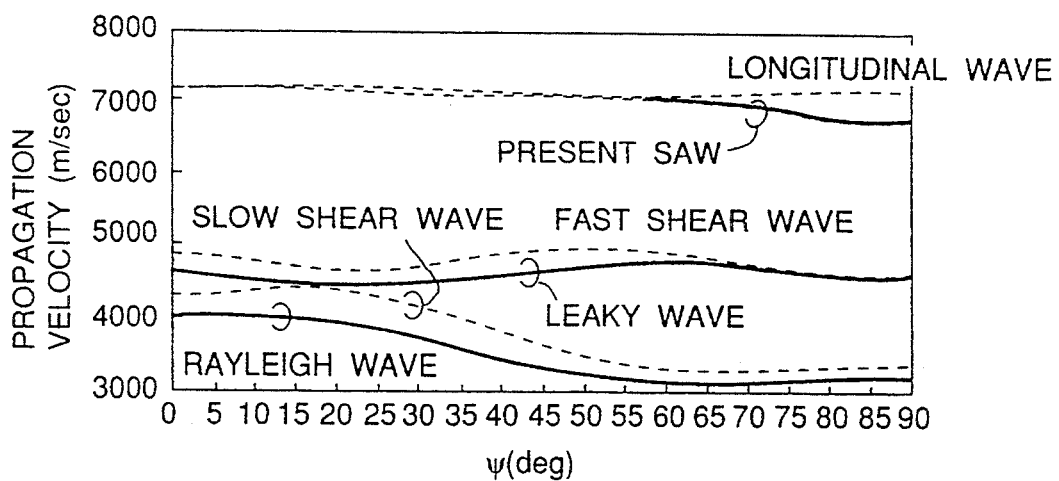
FIG. 14 is a graph of the result of the simulation, in a surface acoustic wave device including electrodes of aluminium as the main component formed on a lithium tetraborate single crystal substrate, on a propagation velocity $v_p$ obtained when a propagation direction ψ is changed on a (011) cut surface of the substrate.
Figure 15:
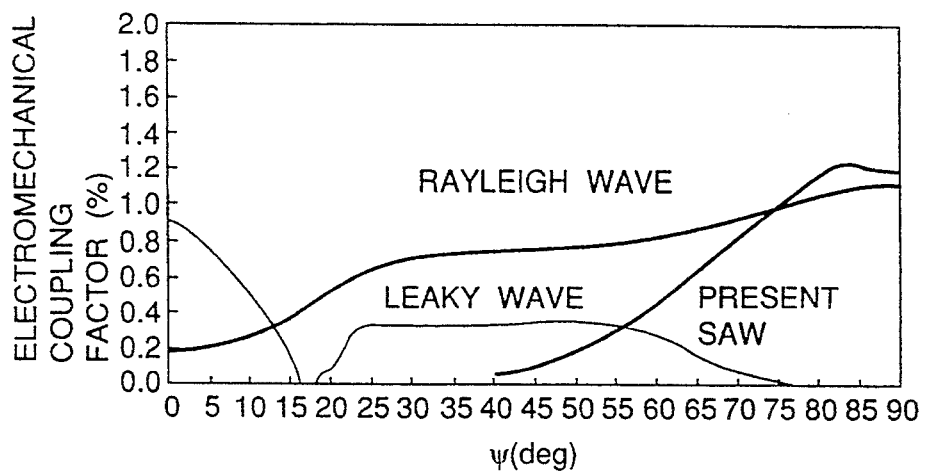
FIG. 15 is a graph of the result of the simulation, in a surface acoustic wave device including electrodes of aluminium as the main component formed on a lithium tetraborate single crystal substrate, on an electromechanical coupling factor $k^2$ obtained when a propagation direction ψ is changed on a (011) cut surface of the substrate.
Figure 16:
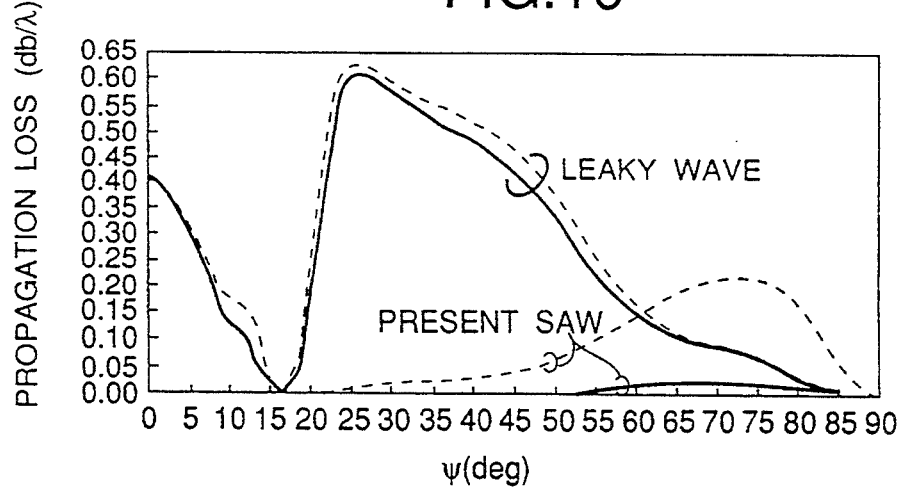
FIG. 16 is a graph of the result of the simulation, in a surface acoustic wave device including electrodes of aluminium as the main component formed on a lithium tetraborate single crystal substrate, on a propagation loss L obtained when a propagation direction ψ is changed on a (011) cut surface of the substrate.
Figure 17:
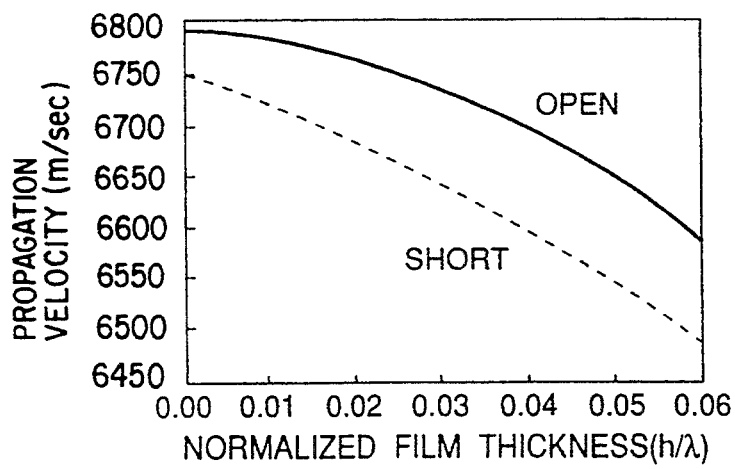
FIG. 17 is a graph of the result of the simulation, in a surface acoustic wave device including electrodes of aluminium as the main component formed on a lithium tetraborate single crystal substrate, on a propagation velocity $v_p$ obtained when a normalized film thickness h/λ of the electrodes is changed with the cut angle of the lithium tetraborate single crystal substrate and a propagation direction set at an Eulerian angle representation of (0°, 47.3°, 90°)
Figure 18:
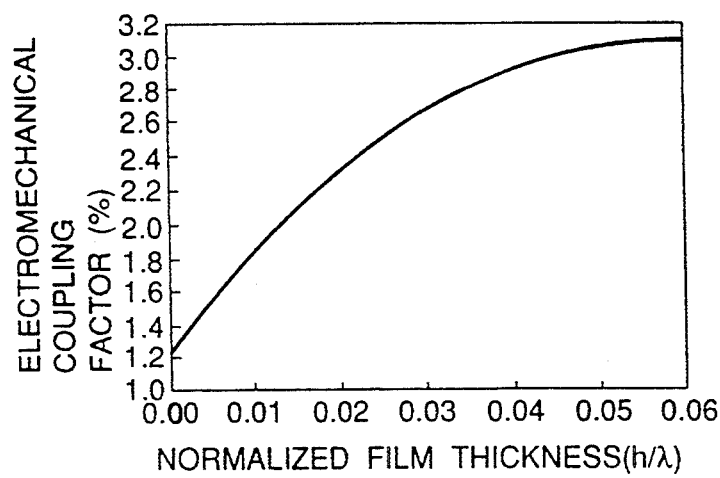
FIG. 18 is a graph of the result of the simulation, in a surface acoustic wave device including electrodes of aluminium as the main component formed on a lithium tetraborate single crystal substrate, on an electromechanical coupling factor $k^2$ obtained when a normalized film thickness h/λ of the electrodes is changed with the cut angle of the lithium tetraborate single crystal substrate and a propagation direction set at an Eulerian angle representation of (0°, 47.3°, 90°)
Figure 19:
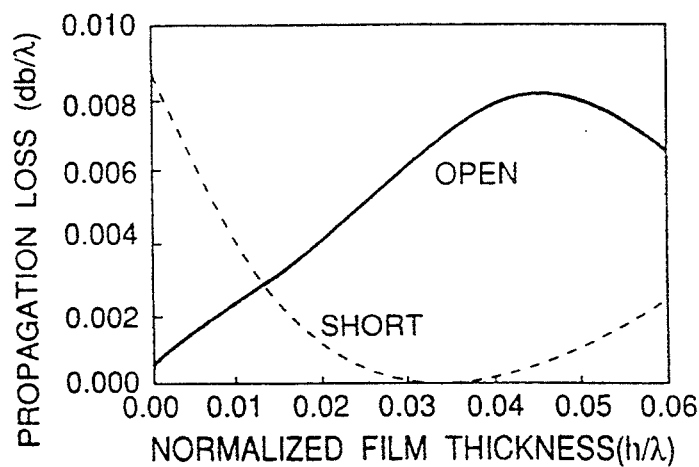
FIG. 19 is a graph of the result of the simulation, in a surface acoustic wave device including electrodes of aluminium as the main component formed on a lithium tetraborate single crystal substrate, on a propagation loss L obtained when a normalized film thickness h/λ of the electrodes is changed with the cut angle of the lithium tetraborate single crystal substrate and a propagation direction set at an Eulerian angle representation of (0°, 47.3°, 90°)
Figure 20:
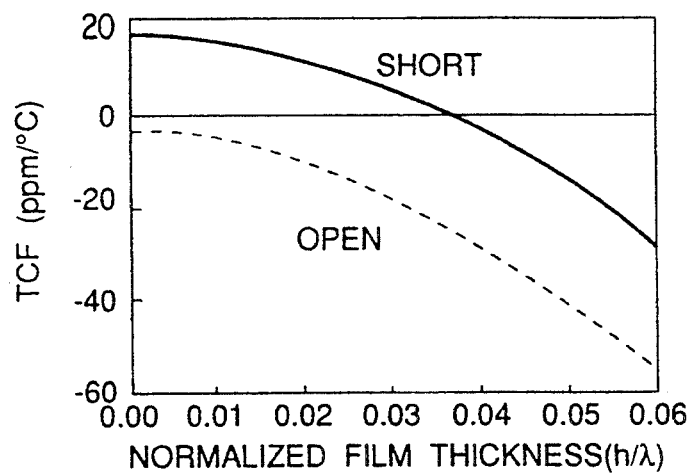
FIG. 20 is a graph of the result of the simulation, in a surface acoustic wave device including electrodes of aluminium as the main component formed on a lithium tetraborate single crystal substrate, on a temperature coefficient of frequency TCF obtained when a normalized film thickness h/λ of the electrodes is changed with the cut angle of the lithium tetraborate single crystal substrate and a propagation direction set at an Eulerian angle representation of (0°, 47.3°, 90°)
Figure 21:
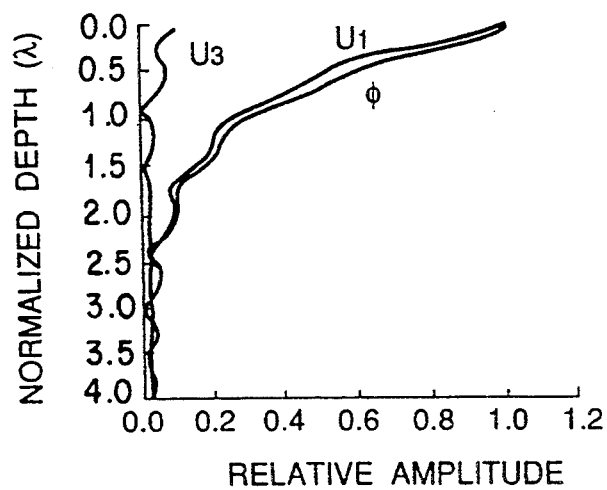
FIG. 21 is a graph of the result of the simulation, in a surface acoustic wave device including electrodes of aluminium as the main component which is so formed on a lithium tetraborate single crystal substrate that the propagation direction of the surface acoustic wave is (0°, 47.3°, 90°), on displacement distributions $U_1$, $U_3$ and an electrostatic potential distribution in depth of the substrate when the surface of the substrate is electrically opened.
Figure 22:
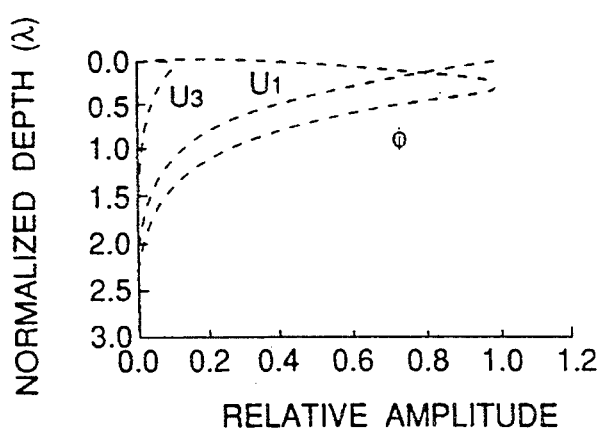
FIG. 22 is a graph of the result of the simulation, in a surface acoustic wave device including electrodes of aluminium as the main component which is so formed on a lithium tetraborate single crystal substrate that the propagation direction of the surface acoustic wave is (0°, 47.3°, 90°), on displacement distributions $U_1$, $U_3$ and an electrostatic potential distribution in depth of the substrate when the surface of the substrate is electrically shorted.
Figure 23:
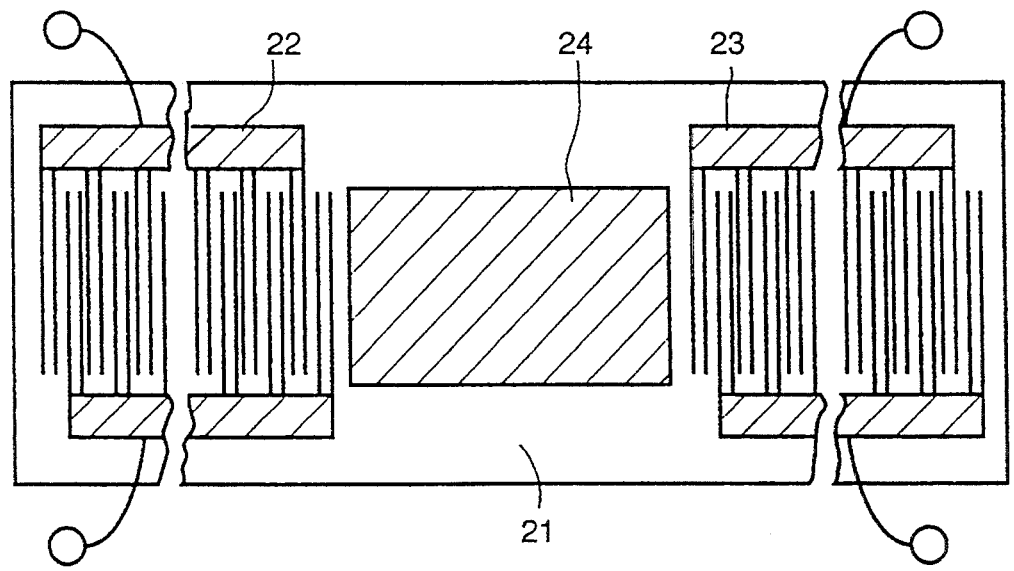
FIG. 23 is a view of the surface acoustic device according to one example of the present invention.

The surface acoustic wave device according to the present example is shown in FIG. 23. The surface acoustic wave device according to the present example is a transversal filter or a delay line, and comprises input interdigital transducers 22 and output interdigital transducers 23 formed on the surface of a piezoelectric substrate 21 of lithium tetraborate single crystal having (011) plane as the principal plane, each transducer including double interdigital electrodes of a $\lambda/8$-electrode line width, and metal films 24 formed between the respective input interdigital transducers 22 and their adjacent one of the output interdigital transducers 23.

The input interdigital transducers 22 and the output interdigital transducers 23 are formed in 20 pairs and have a period of 8 μm (electrode line width: 1 μm) and an aperture of 400 μm. The transducers 22 and 23 are so formed that the propagation direction of the surface acoustic wave is an Eulerian angle representation of (0°, 47.3°, 90°). The input interdigital transducer 22 and the output interdigital transducer 23, and the metal films 24 are formed of aluminium film of the same thickness.

The propagation velocity of the surface acoustic wave was measured based on a peak frequency of frequency response, the electromechanical coupling factor of the surface acoustic wave was measured based on a radiation admittance of the interdigital transducers, the propagation loss of the surface acoustic wave was measured based on changes of an insertion loss when the propagation path length was changed to 100 $\lambda$ ($\lambda$ represents a wavelength of the surface acoustic wave), 200 $\lambda$ and 300 $\lambda$, and the temperature coefficient of frequency of the surface acoustic wave was measured based on temperature changes of the center frequencies of the frequency response.

Figure 24:
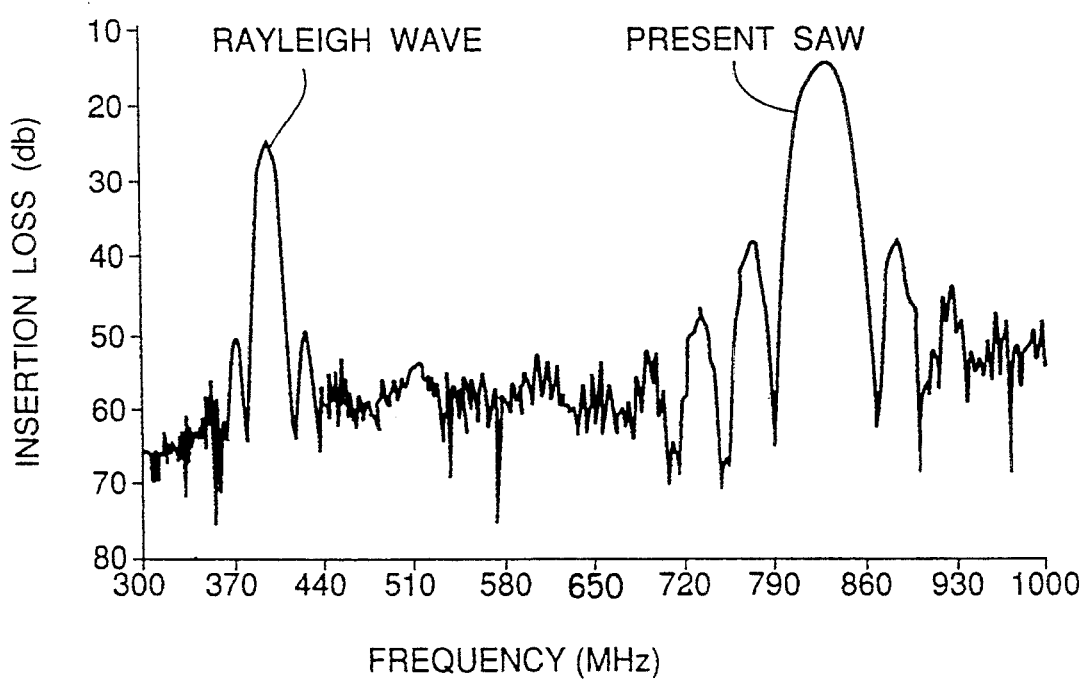
FIG. 24 is a graph of the frequency response of the surface acoustic wave device of FIG. 23 having an cut angle and a propagation direction represented in an Eulerian angle (0° 47.3° 90°)
Figure 25:
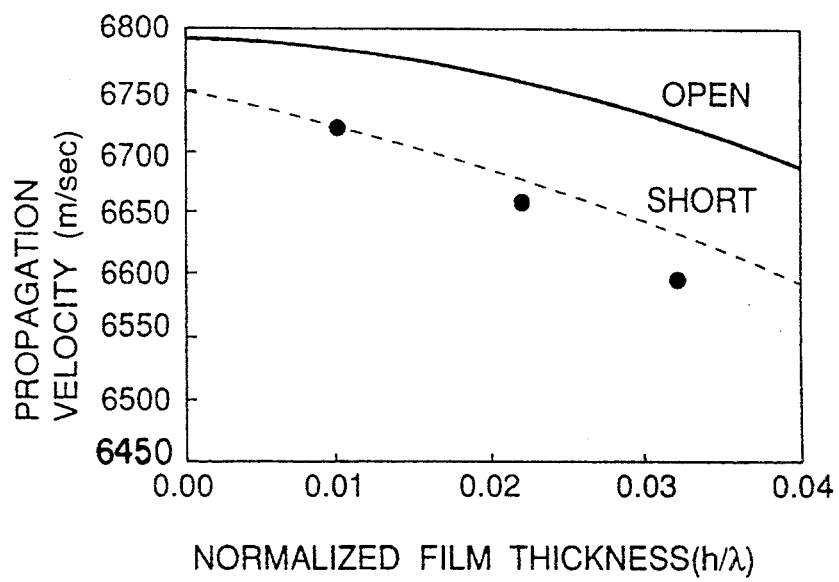
FIG. 25 is a graph of the results of the measurement and simulation on a propagation velocity $v_p$ obtained when a normalized film thickness $h/\lambda$ of the electrodes is changed in the surface acoustic wave device of FIG. 23 having an cut angle and a propagation direction represented in an Eulerian angle (0° 47.3° 90°)
Figure 26:
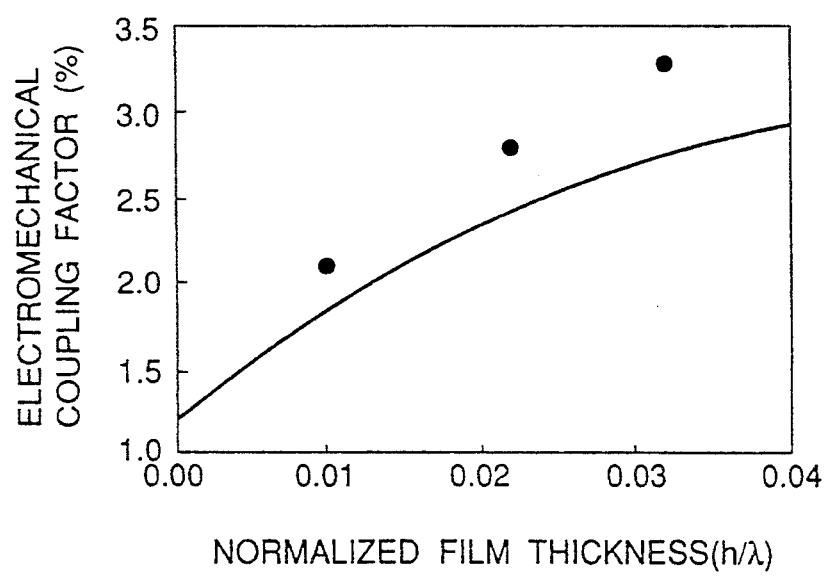
FIG. 26 is a graph of the results of the measurement and simulation on an electromechanical coupling factor $k^2$ obtained when a normalized film thickness $h/\lambda$ of the electrodes is changed in the surface acoustic wave device of FIG. 23 having an cut angle and a propagation direction represented in an Eulerian angle (0° 47.3° 90°)
Figure 27:
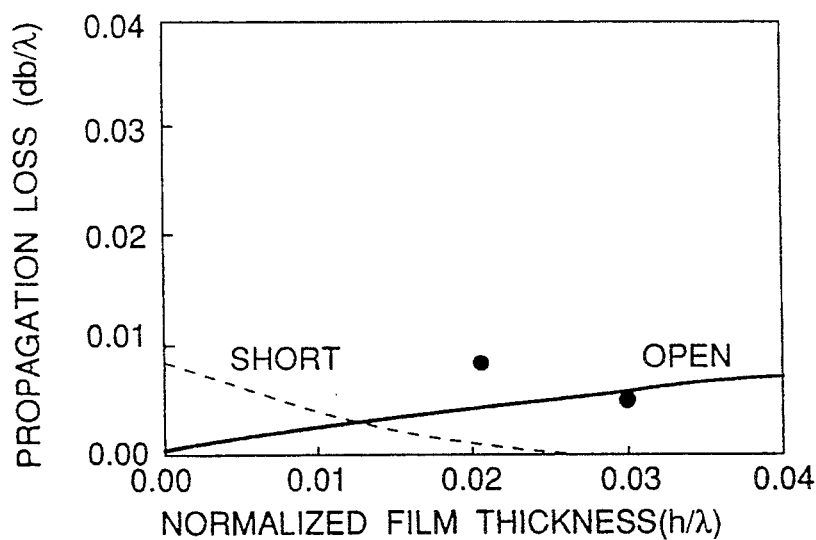
FIG. 27 is a graph of the results of the measurement and simulation on a propagation loss L obtained when a normalized film thickness $h/\lambda$ of the electrodes is changed in the surface acoustic wave device of FIG. 23 having an cut angle and a propagation direction represented in an Eulerian angle (0° 47.3° 90°)
Figure 28:
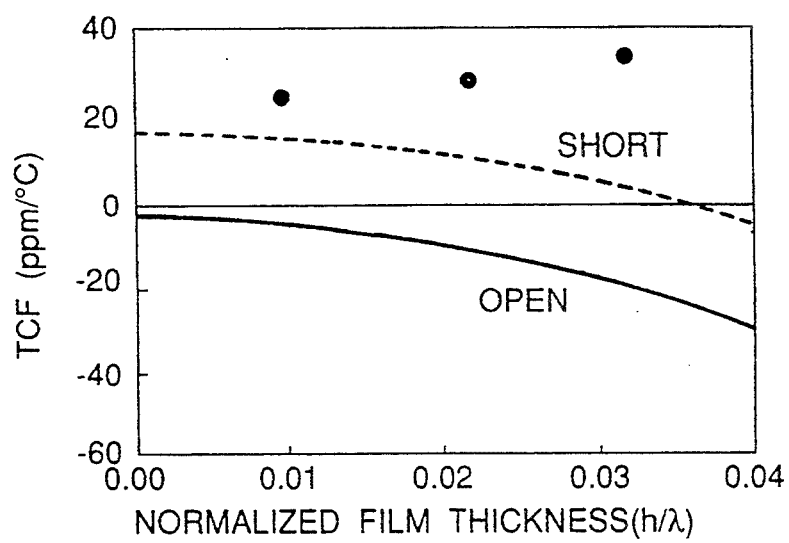
FIG. 28 is a graph of the results of the measurement and simulation on a temperature coefficient of frequency TCF obtained when a normalized film thickness $h/\lambda$ of the electrodes is changed in the surface acoustic wave device of FIG. 23 having an cut angle and a propagation direction represented in an Eulerian angle (0° 47.3° 90°)

FIG. 24 shows the result of the measurement of the case in which the thickness of the aluminium films was 177 nm (normalized film thickness: 2.2%), and the propagation path length was 800 μm.

As shown in FIG. 24, a peak corresponding to the present SAW exits at a frequency of 832 MHz. The insertion loss of the present SAW is as low as 13.7 dB, and its propagation velocity is so high as 6656 m/sec.

A peak corresponding to the Rayleigh wave exists at a frequency of 400 MHz. The insertion loss of the Rayleigh wave is 24.1 dB, and its propagation velocity is 3204 m/sec.

In the present SAW and the Rayleigh wave, the experimental results and the result of the simulation well agree with each other. FIGS. 25, 26, 27 and 28 respectively show, together with the result of the simulation, measured propagation velocities, electromechanical coupling factors, propagation losses and temperature coefficients of frequency obtained when the film thickness of the aluminium film was changed (indicated by ●).

As shown in FIGS. 25 to 28, the experimental results and the simulated results well agree with each other, and good propagation characteristics for a surface acoustic wave device for high frequency-use could be prepared. For example, when the normalized film thickness of the aluminium films is 2%, the propagation velocity is about 6650 m/sec, the electromechanical coupling factor is about 2.8%, the propagation loss is about 0.016 dB/$\lambda$, the TCF is about +30 ppm/°C.

The surface acoustic wave device according to another example of the present invention will be explained with reference to FIG. 29.

Similarly with the surface acoustic wave device of FIG. 23, the surface acoustic device according to the present example comprises input interdigital transducers 22 and output interdigital transducers 23 formed on the surface of a piezoelectric substrate 21 of lithium tetraborate single crystal, and metal films 24 formed between the respective transducers 22 and their adjacent output transducers 24. The cut angle of the piezoelectric substrate 21 and the propagation direction of the surface acoustic wave are an Eulerian angle representation of (45°, 40°, 90°), and in the other respect the surface acoustic wave device according to the present example is the same as that of FIG. 23.

Figure 29:
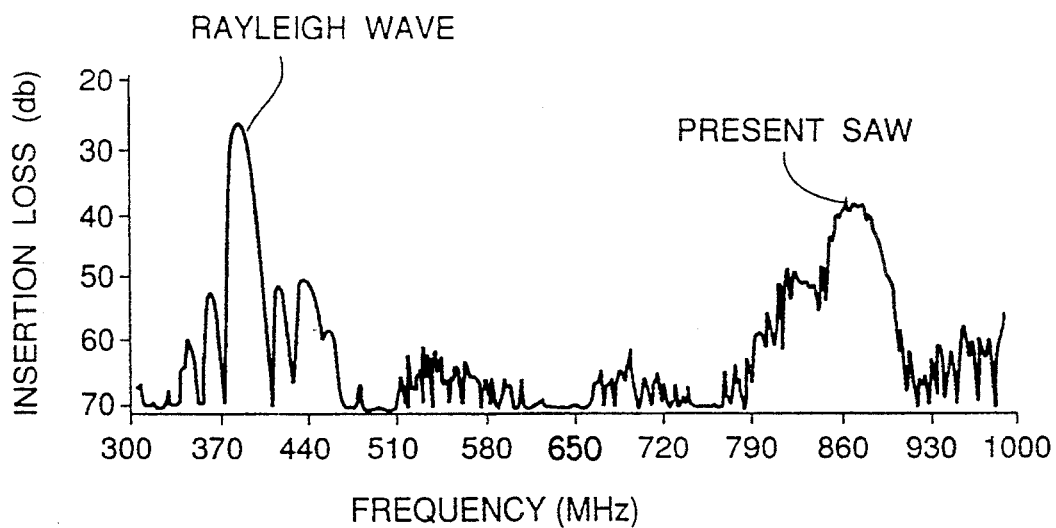
FIG. 29 is a graph of the frequency response of the surface acoustic wave device according to another example of the present invention having an cut angle and a propagation direction represented in an Eulerian angle (45° 40° 90°)
Figure 31:
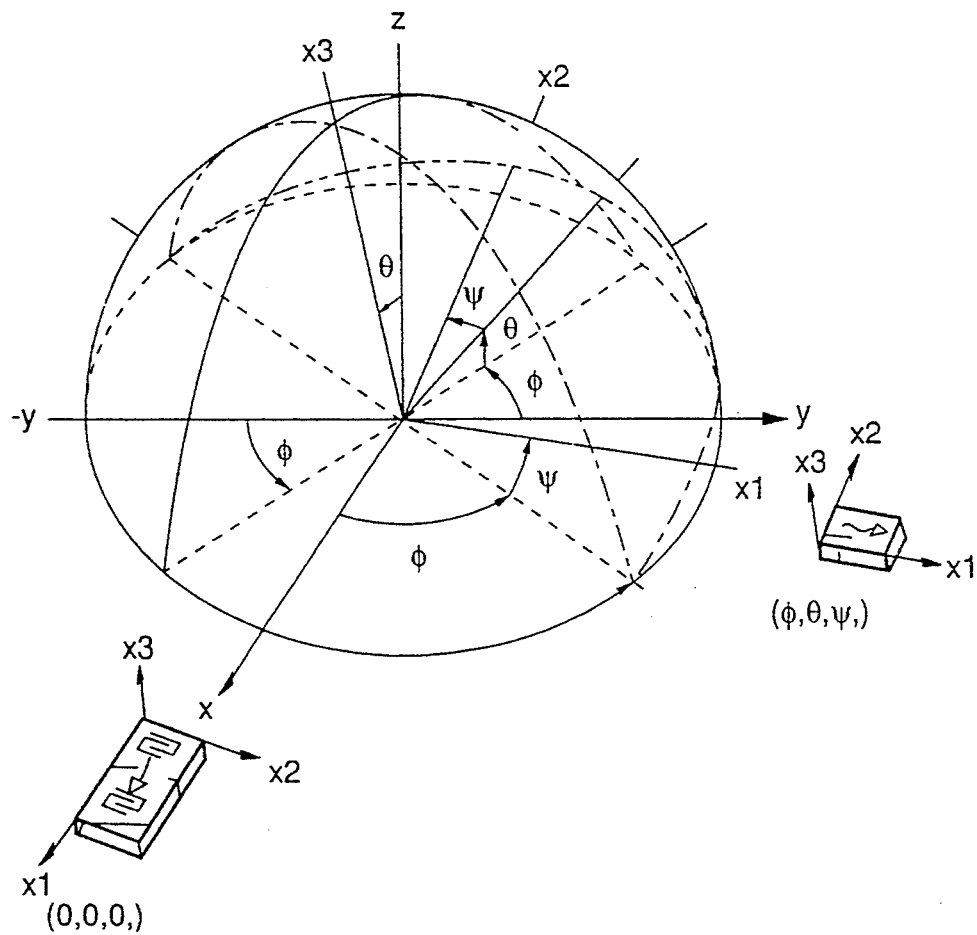
FIG. 31 is a view explaining the Eulerian angle representation.

FIG. 29 shows the measured results of the pass frequency response obtained when the film thickness of the aluminium films was 245 nm (normalized film thickness: 3.0%), and the propagation passage length was 800 μm.

As shown in FIG. 29, a peak corresponding to the present SAW exits at a frequency of 883 MHz. The insertion loss of the present SAW is 38.5 dB, its propagation velocity is so high as 7070 m/sec, and the electromechanical coupling factor is 1.6%.

At a frequency of 389 MHz, a peak corresponding to the Rayleigh wave exits. The insertion loss of the Rayleigh wave is 25.6 dB, and its propagation velocity is 3110 m/sec. In the SAW and the Rayleigh wave, the experimental results and the simulated results well agree with each other.

The present invention is not limited to the above-described embodiment and covers other variations and modifications.

Figure 30A:
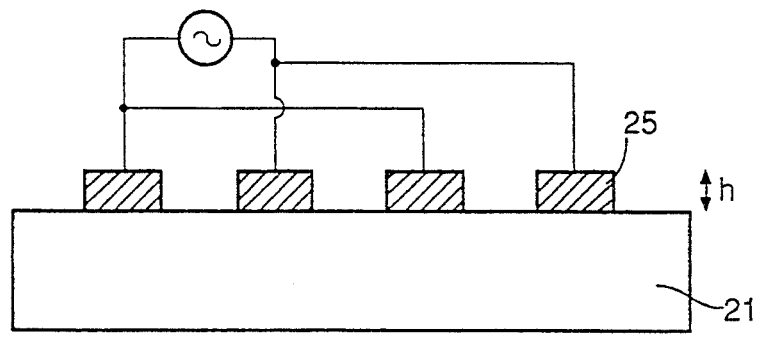
FIGS. 30A to 30E are views of sectional structures of variations of the interdigital transducers used in the surface acoustic wave device according to the present invention.
Figure 30B:
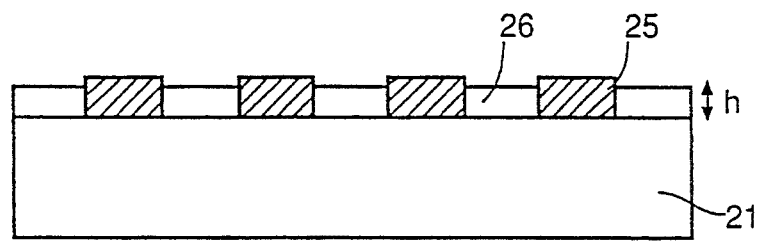
Figure 30C:
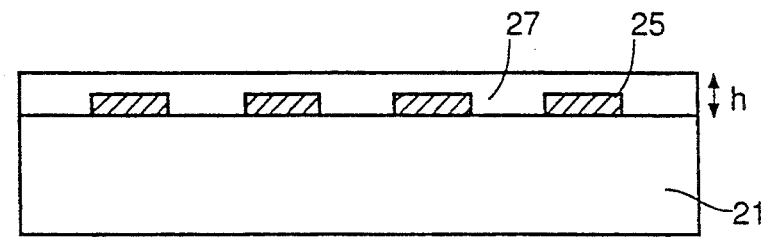
Figure 30D:
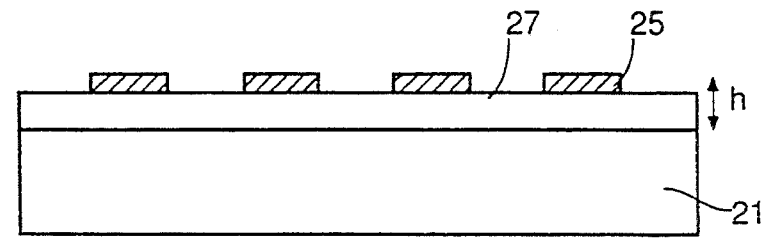
Figure 30E:
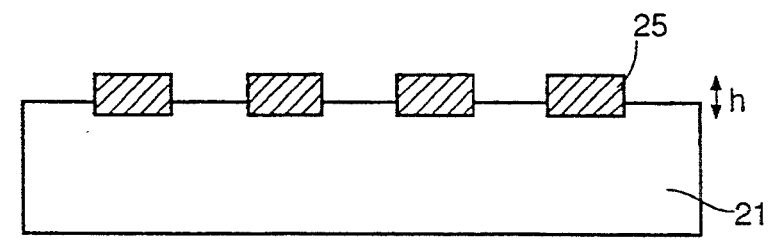

Although in the above-described examples, as shown in FIG. 30A, the finger electrodes 25 of the input interdigital transducers 22 and the output interdigital transducers 23 are formed directly on the surface of the piezoelectric substrate 21 of the surface acoustic wave device, various sectional structures as shown in FIG. 30 are available. As shown in FIG. 30B, the intervals between the finger electrodes 25 may be buried with insulating layers 26 of $SiO_2$, $Al_2O_3$ or others. As shown in FIG. 30C, all the finger electrodes 25 may be buried with an insulating layer 27 of $SiO_2$, $Al_2O_3$ or others. As shown in FIG. 30D the finger electrodes 25 may be formed on an insulating layer 27 formed on the piezoelectric substrate 21. As shown in FIG. 30E, the surface of the piezoelectric substrate 21 may be grooved to implant the finger electrodes 25 in the grooves. In FIGS. 30C and 30D, the film thickness of the electrodes is a total thickness of the finger electrodes 25 and the insulating film 27.

The metal forming the finger electrodes of the surface acoustic wave device may be a metal containing gold as the main component in place of a metal containing aluminium as the main component. These metals may contain silicon, copper or others. The electrodes may have multi-layer structures including a titanium layer, a tungsten layer or others.

The surface acoustic wave devices according to the above-described examples were transversal filters including the metal films on the propagation path, but the metal films may be omitted.

The surface acoustic wave device does not have essentially the structures of the above-described examples. The present invention is also applicable to, e.g., resonators, resonator-type filters including an interdigital transducer between a pair of grating reflectors. The present invention is also applicable to a surface acoustic wave device including a number of parallelly connected interdigital transducers (IIDT structure).

What is claimed is:

1. A surface acoustic wave device comprising a piezoelectric substrate of lithium tetraborate single crystal, and a metal film formed on a surface of the piezoelectric substrate for exciting, receiving, reflecting and/or propagating surface acoustic waves, the metal film being so formed that a cut angle of the surface of the piezoelectric substrate and propagation direction of the surface acoustic wave are an Eulerian angle representation of (0°–45°, 38°–55°, 80°–90°) and directions equivalent thereto, a propagation velocity of the surface acoustic wave being higher than a propagation velocity of a fast shear bulk wave propagating in the same direction as the surface acoustic wave and not exceeding that of a longitudinal bulk wave.

2. A surface acoustic wave device according to claim 1, wherein the metal film are so formed that a cut angle of the surface of the piezoelectric substrate and propagation direction of the surface acoustic wave are an Eulerian angle representation of (0°–45°, 45°–50°, 80°–90°) and directions equivalent thereto.

3. A surface acoustic wave device according to claim 2, wherein the metal film are so formed that a cut angle of the surface of the piezoelectric substrate and propagation direction of the surface acoustic wave are an Eulerian angle representation of (0°–2°, 45°–50°, 88°–90°) and directions equivalent thereto.

4. A surface acoustic wave device according to claim 1, wherein the metal film are formed of a metal containing aluminium as the main component, and the metal film have a normalized film thickness of below about 8%.

5. A surface acoustic wave device according to claim 2, wherein the metal film are formed of a metal containing aluminium as the main component, and the metal film have a normalized film thickness of below about 8%.

6. A surface acoustic wave device according to claim 4, wherein the metal film are formed of a metal containing aluminium as the main component, and the metal film have a normalized film thickness of 0.5–3.5%.

7. A surface acoustic wave device according to claim 5, wherein the metal film are formed of a metal containing aluminium as the main component, and the metal film have a normalized film thickness of 0.5–3.5%.

8. A surface acoustic wave device according to claim 1, wherein the surface acoustic wave device is a transversal filter having a electrode formed of the metal film.

9. A surface acoustic wave device according to claim 2, wherein the surface acoustic wave device is a transversal filter having a electrode formed of the metal film.

10. A surface acoustic wave device according to claim 1, wherein the surface acoustic wave device is a delay line having a electrode formed of the metal film.

11. A surface acoustic wave device according to claim 2, wherein the surface acoustic wave device is a delay line having a electrode formed of the metal film.

12. A surface acoustic wave device comprising a piezoelectric substrate of lithium tetraborate single crystal, and a metal film formed on a surface of the piezoelectric substrate for exciting, receiving, reflecting and/or propagating surface acoustic waves, the metal film being so formed that a cut angle of the surface of the piezoelectric substrate and propagation direction of the surface acoustic wave area are an Eulerian angle representation of (0°–45°, 30°–75°, 40°–90°) and directions equivalent thereto, a propagation velocity of the surface acoustic wave being higher than a propagation velocity of a fast shear bulk wave propagating in the same direction as the surface acoustic wave and not exceeding that of a longitudinal bulk wave.

13. A surface acoustic wave device comprising a piezoelectric substrate of lithium tetraborate single crystal, and a metal film formed on a surface of the piezoelectric substrate for exciting, receiving, reflecting and/or propagating surface acoustic waves, the metal film being so formed that a cut angle of the surface of the piezoelectric substrate and propagating direction of the surface acoustic wave are an Eulerian angle representation of (0°–45°, 30°–75°, 40°–90°) and directions equivalent thereto, a propagation velocity of the surface acoustic wave being higher than a propagating velocity of a fast shear bulk wave propagating in the same direction as the surface acoustic wave and not exceeding that of a longitudinal bulk wave.

14. A surface acoustic wave device comprising a piezoelectric substrate of lithium tetraborate single crystal, and a metal film formed on a surface of the piezoelectric substrate for exciting, receiving, reflecting and/or propagating surface acoustic waves, the metal film being so formed that a cut angle of the surface of the piezoelectric substrate and propagation direction of the surface acoustic wave are an Eulerian angle representation of (0°–45°, 30°–90°, 40°–65°) and directions equivalent thereto, a propagation velocity of the surface acoustic wave being higher than a propagation velocity of a fast shear bulk wave propagating in the same direction as the surface acoustic wave and not exceeding that of a longitudinal bulk wave.

15. A surface acoustic wave device according to claim 12, wherein the metal film are formed of a metal containing aluminum as the main component, and the metal film have a normalized film thickness of below about 8%.

16. A surface acoustic wave device according to claim 13, wherein the metal film are formed of a metal containing aluminum as the main component, and the metal film have a normalized film thickness of below 8%.

17. A surface acoustic wage device according to claim 14, wherein the metal film are formed of a metal containing aluminum as the main component, and the metal film have a normalized film thickness of below about 8%.

18. A surface acoustic wave device according to claim 15, wherein the metal film are formed of a metal containing aluminum as the main component, and the metal film have a normalized film thickness of 0.5–3.5%.

19. A surface acoustic wave device according to claim 16, wherein the metal film are formed of a metal containing aluminum as the main component, and the metal film have a normalized film thickness of 0.5–3.5%.

20. A surface acoustic wave device according to claim 17, wherein the metal film are formed of a metal containing aluminum as the main component, and the metal film have a normalized film thickness of 0.5–3.5%.

21. A surface acoustic wave device according to claim 12, wherein the surface acoustic wave device is a transversal filter having a electrode formed of the metal film.

22. A surface acoustic wave device according to claim 19, wherein the surface acoustic wave device is a transversal filter having a electrode formed of the metal film.

23. A surface acoustic wave device according to claim 14, wherein the surface acoustic wave device is a transversal filter having a electrode formed of the metal film.

24. A surface acoustic wave device according to claim 12, wherein the surface acoustic wave device is a delay line having a electrode formed of the metal film.

25. A surface acoustic wave device according to claim 13, wherein the surface acoustic wave device is a delay line having a electrode formed of the metal film.

26. A surface acoustic wave device according to claim 14, wherein the surface acoustic wave device is a delay line having a electrode formed of the metal film.

27. A surface acoustic wave device comprising a piezoelectric substrate of lithium tetraborate single crystal, and a metal film formed on a surface of the piezoelectric substrate for exciting, receiving, reflecting and/or propagating surface acoustic waves, the metal film being so formed that a cut angle of the surface of the piezoelectric substrate and propagation direction of the surface acoustic wave are on Eulerian angle representation of (0°–45°, 30°–70°, 40°–90°) and directions equivalent thereto, a propagation velocity of the surface acoustic wave being higher than a propagation velocity of a fast shear bulk wave propagating in the same direction as the surface acoustic wave and not exceeding that of a longitudinal bulk wave.

28. A surface acoustic wave device comprising a piezoelectric substrate of lithium tetraborate single crystal, and a metal film formed on a surface of the piezoelectric substrate for exciting, receiving, reflecting and/or propagating surface acoustic waves, the metal film being so formed that a cut angle of the surface of the piezoelectric substrate and propagation direction of the surface acoustic wave are an Eulerian angle representation of (0°–45°, 38°–55°, 40°–90°) and directions equivalent thereto, a propagation velocity of the surface acoustic wave being higher than a propagation velocity of a fast shear bulk wave propagating in the same direction as the surface acoustic wave and not exceeding that of a longitudinal bulk wave.

* * * * *